United States Patent [19]

Finnegan

[11] 3,725,902

[45] Apr. 3, 1973

[54] OPTICAL ENDCODER

[75] Inventor: Ronald A. Finnegan, South Windsor, Conn.

[73] Assignee: Veeder Industries Inc., Hartford, Conn.

[22] Filed: July 1, 1970

[21] Appl. No.: 51,509

[52] U.S. Cl. ............340/347 P, 340/190, 250/231 SE

[51] Int. Cl. ............G08c 9/06

[58] Field of Search ............340/347, 233, 271, 190; 250/231 SE, 219 CR; 178/7.6

[56] References Cited

UNITED STATES PATENTS

| | | | |
|---|---|---|---|
| 2,724,183 | 11/1955 | Edison | 340/347 P UX |
| 2,755,020 | 7/1956 | Belcher, Jr. | 340/347 P |
| 3,218,631 | 11/1965 | Flieg et al. | 340/347 |
| 2,981,844 | 4/1961 | Broxon | 340/347 |
| 3,252,157 | 5/1966 | Pabst | 340/347 |
| 2,747,797 | 5/1956 | Beaumont | 250/233 UX |
| 2,898,801 | 8/1959 | Rockafellow | 250/233 X |
| 2,989,642 | 6/1961 | Svec | 250/231 SE |

*Primary Examiner*—Charles D. Miller
*Attorney*—Prutzman, Hayes, Kalb & Chilton

[57] ABSTRACT

An optical encoder is provided with a new and improved exposure assembly comprising a readily replaceable exposure block fixedly mounting a plurality of individual light bulbs within a predetermined display pattern, a base for the exposure block supporting an apertured display mask within a code display station and aligning means on both the block and the base facilitating accurate and repeated aligned assembly of the block on the base without readjustment of the assembly.

8 Claims, 4 Drawing Figures

INVENTOR
RONALD A. FINNEGAN

BY Prutzman, Hayes, Kalb and Chilton
ATTORNEYS

OPTICAL ENDCODER

BACKGROUND AND SUMMARY OF THE INVENTION

The present invention relates generally to a shaft position encoder for monitoring process and machine motions. More particularly, it is concerned with an improved optical encoder suited for use in an absolute shaft position indicator and with a new and improved exposure assembly design for such an encoder.

In recent years an increasing number and variety of shaft position encoders have been developed employing both single or multiple code bearing members. Generally such code bearing members utilize a binary code system and contain single or composite information bits which, in an optical encoder, take the form of light transmitting areas or opaque areas. A typical example of an optical encoder employing such code-bearing members is the structure described in United States Patent application, Ser. No. 494,524 entitled "Shaft Position Encoders" and filed on Oct. 11, 1965, the disclosure of which is incorporated by reference. In that device overlapping high speed and low speed code-bearing discs are appropriately geared together to advance continuously and provide successive composite code combinations. The high speed code disc is provided with a plurality of spiral masks which effect display of certain portions of the low speed disc disposed in the sensing position. Offset portions of the spiral masks provide instantaneous output changes and produce high accuracy both in straightforward binary digital codes and in cyclic code systems.

As described in the aforementioned application, the encoder utilizes a conventional exposure-readout arrangement or system employing a single incandescent light bulb with a suitably configured reflector accurately positioned to assure appropriate distribution of the light for displaying the composite code pattern. Although other optical encoders have utilized multiple light sources, insufficient consideration has been given to a simple compact arrangement or design for the exposure assembly of the encoder.

Accordingly, it is a primary object of the present invention to provide a new and improved shaft position encoder of the type described having a new and improved exposure assembly adapted for rapid, facile and accurate initial alignment coupled with the capability of easy removal and reassembly without the necessity for changing or adjusting the relative positions of its associated components. In this way precise and accurate alignment of the light source is assured at all times.

It is also an object of the present invention to provide a position encoder of the type described having a single replaceable exposure block carrying a multibeam light source for accurate and rapid assembly within the encoder, the light block being designed to obviate the necessity for repeated realignment of any of the encoder's exposure station components while avoiding undesirable alteration in the intensity of light beams at different locations in the light block upon replacement of the light source.

Another object of the present invention is to provide an encoder of simplified and standardized construction facilitating replacement of a fully aligned multilight unit with a high degree of accuracy and precision, thereby substantially reducing the down time of the encoder while assuring proper positioning and intensity of the parallelized light beams.

A further object of the present invention is to provide an optical shaft position encoder of the type described having an improved multilight subassembly of durable construction facilitating not only rapid and accurate assembly of the encoder but also compact construction and more economical production.

Other objects will be in part obvious and in part pointed out in more detail hereinafter.

These and related objects are accomplished in accordance with the present invention by providing a shaft position encoder of the type described having a readily replaceable exposure block fixedly mounting a plurality of separate exposure beam sources in a predetermined pattern, a base for the exposure block supporting an apertured exposure mask within a code display area and cooperative aligning means on the block and the base facilitating accurate and repeated assembly of the block on the base without readjustment of other members of the encoder.

A better understanding of the objects, advantages, features, properties and relationships of the invention will be obtained from the following detailed description and accompanying drawing which set forth an illustrative embodiment and are indicative of the way in which the principle of the invention is employed.

DESCRIPTION OF A PREFERRED EMBODIMENT

Figures 1, 2, 3, 4:
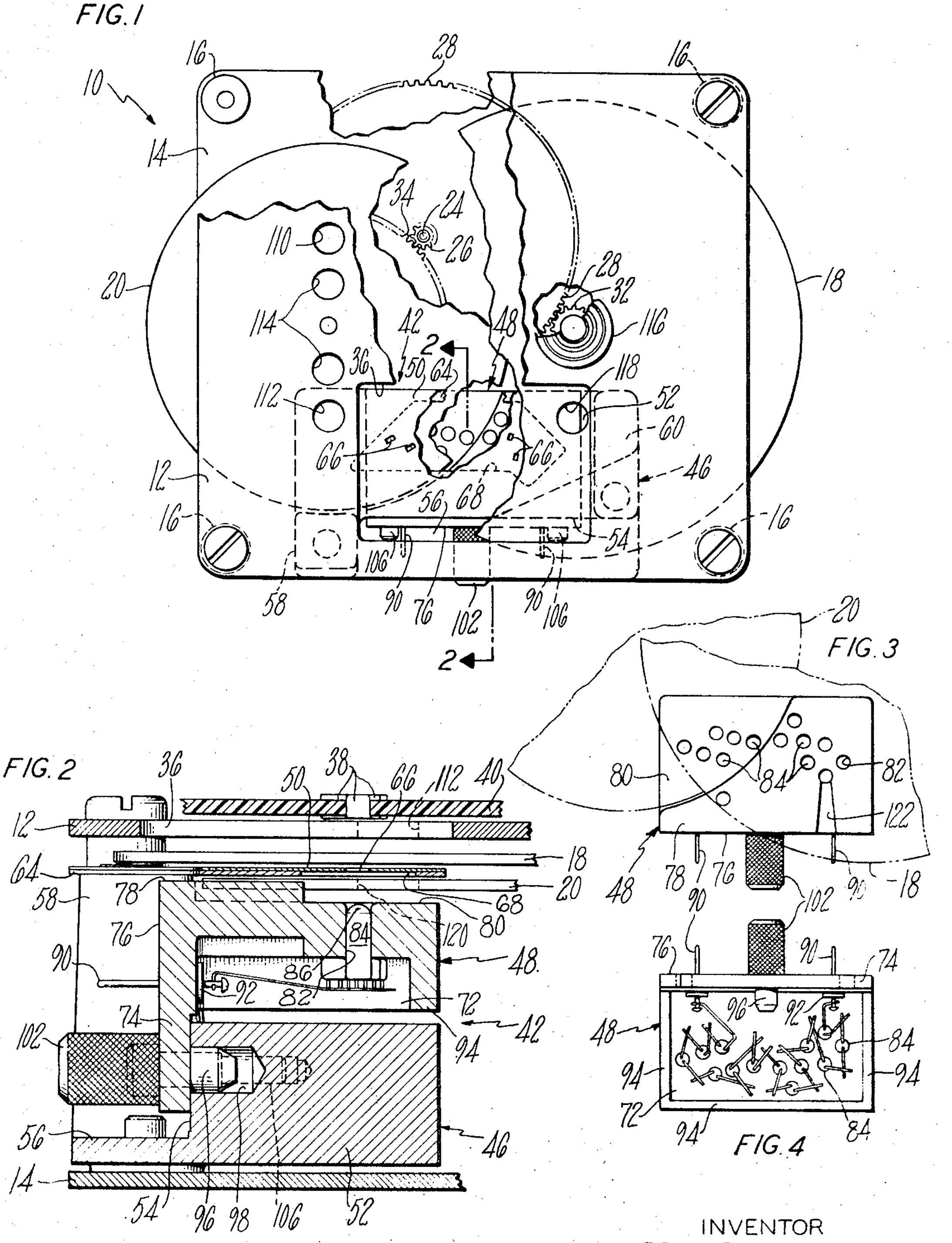
FIG. 1 is a plan view of an optical encoder incorporating the features of the present invention, the encoder being partially broken away and the photoconductive readout sensors being removed to reveal various internal components of the encoder.
FIG. 2 is an enlarged sectional view taken along the lines 2—2 of FIG. 1 illustrating an embodiment of the encoder's exposure assembly.
FIG. 3 is a partial top plan view depicting the light block employed in the exposure assembly of FIG. 1.
FIG. 4 is a bottom plan view of the light block shown in FIG. 3.

Referring now to the drawing in greater detail wherein like reference numerals indicate like parts throughout the several figures, there is shown one embodiment of an optical encoder 10 incorporating the features of the present invention. The encoder includes a pair of flat support plates 12, 14 secured in spaced parallel relationship by four corner posts 16. A high speed code-bearing disc 18 and a low speed code-bearing disc 20 are supportably mounted for rotation between the top and bottom support plates 12 and 14, respectively. The discs rotate within spaced parallel planes and are positioned in partially overlapping relationship immediately below but adjacent to the top support plate 12. An input shaft 24, suitably connected to the device having its movement encoded, passes through the bottom plate 14 and fixedly carries driving gears 26, 28 for simultaneously and continuously driving the respective driven gears 32, 34 fixedly connected to the high and low speed code discs 18 and 20, respectively. A generally rectangular aperture 36 in top plate 12 is spaced slightly from one edge intermediate the corner posts 16 and permits communication between a plurality of photoconductive readout sensors 38 mounted on a circuit board 40 overlying plate 12 and a display area of the encoder through which segments of both code-bearing discs pass during their rotation.

An encoder exposure assembly, generally designated by the numeral 42, is mounted at the display area below the aperture 36 for exposing selected information bits on the code-bearing discs 18 and 20. The assembly 42 includes a generally U-shaped base member 46 mounted on bottom plate 14, an exposure block 48 accurately and alignably supported by the base member 46 for easy removal and replacement, and an apertured display mask 50 secured to the base member 46 and positioned in the exposure area above the exposure block 48 and between the discs 18 and 20.

The base member 46 is a solid cast aluminum member comprised of a generally rectangular central body portion 52 having a precisely machined longitudinally extending front wall 54 for mounting the exposure block 48 and a flat mounting flange 56 extending outwardly from the front wall 54 along the full length of the base member. Integral posts 58, 60 extend upwardly at right angles from opposite ends of the central portion 52 to complete the U-shaped configuration. The post 58 closest to low speed disc 20 is positioned adjacent flange 56 to fully accommodate the disc and permit its uninterrupted rotation while post 60 extends across the full width of the base member's central body portion. A display mask assembly consisting of a thin multi-apertured display mask 50 and a thin bracing plate 64 is fixedly mounted on top of the posts 58, 60 within a plane parallel to and intermediate the planes of rotation of the code-bearing discs 18 and 20. As best shown in FIG. 1 the display mask 50 is provided with a patterned grouping of exposure apertures 66 corresponding to the arrangement of the photoconductive readout sensors 38, the exposure apertures 66 being outlined by the contoured, display area-defining cutout 68 in the bracing plate 64.

The exposure block 48 mounted by the base member 46 is also a cast aluminum member and, as shown in FIG. 2, is of generally L-shaped cross section. The block 48 is comprised essentially of a rectangular box-like compartment 72 and an integral mounting leg 74 forming a planar extension of one longitudinal side 76 of the compartment. The base 78 of the compartment 72 is mounted in confronting relationship to the display area and possesses a terraced configuration with a disc-accommodating arcuate segment 80, as seen in FIGS. 2 and 3, inwardly offset from the remainder of the base by an amount slightly greater than the thickness of the low speed disc 20 which it accommodates. A plurality of parallel bulb-receiving ports 82 extend through the base 78 including the arcuate segment 80. The ports 82 are arranged in a pattern or configuration conforming identically to the predetermined pattern of exposure apertures in the mask 50 and the photocell readout sensors 38. Individual light bulbs 84, secured within each port 82, preferably include lens-like tips 86 for accurately focusing the individual light beams produced thereby toward and through the display station. The bulbs are secured within the ports by a suitable bonding material so that the tip 86 of each bulb rests at the outer surface of the light block's terraced base. The electrical lead wires of the bulbs are electrically connected in series between a pair of terminals 90 projecting through insulated discs 92 mounted in side wall 76 of the compartment. The remaining side walls 94 of the compartment 72 fully surround the lead wires and facilitate the hermetic sealing of the bulb therein. A transparent electrically insulating potting compound or other sealing substance suited for protecting the electrical connections covers the wires and at the same time provides a resilient shock-absorbing closure for the light bulb compartment.

The mounting leg 74 of the exposure block is a flat flange-like member mounted in intimate surface engagement with the front wall 54 of the base member 46. One or more mounting dowels are carried by the leg 74 to assist in mounting the block on the base member. In the embodiment illustrated a single cylindrical mounting and aligning dowel 96 extends centrally through the leg 74 into an aligning cavity 98 in the base member's central body portion. The dowel 96 is provided with a knurled handle 102 extending outwardly from the exposure block to facilitate ready assembly and disassembly of the exposure block on the base member. The exposure block is mounted on the base in such a manner that the bulb compartment 72 overlies the central body portion of the base member and the leg 74 is in intimate surface contact with the accurately machined front wall of the central body portion. Where desired the leg 74 as well as the wall 54 are machined to provide better control and alignment between the base and the exposure block resulting in more accurate positioning of the individual light bulbs by the exposure block. As will be appreciated, the exposure block is preferably secured to the base member by means such as the threaded connectors 106 extending through the mounting leg 74 into the central body portion of the base member. However before securing the block to the base member, it is preferred that the block be accurately positioned, i.e., spaced, relative to the mask carried by the base member. This may be readily accomplished by inserting a shim between the plate 64 and the block before securing the block to the base member.

Advantageously the design of the present invention is such that only a single alignment of code-bearing discs with the exposure assembly is necessary despite subsequent changes of the light source. This is provided by coacting aligning means for each of the discs and the exposure assembly. Such aligning means may consist of visual reference figures at appropriate locations on the discs and assembly. However, in the embodiment illustrated, the encoder is adapted for synchronization by means of a separate aligning fixture adapted for mounting over the top support plate. As shown in FIG. 1, the top support plate 12 of the encoder is provided with a plurality of circular communicating slots 110, 112 and 114 extending in a line from adjacent aperture 36 and positioned in overlying relationship to low speed disc 20. A locating dowel on the aligning fixture fits into the positioning slot 110 and the fixture is attached to the bearing 116 for the high speed disc 18 by means of an aperture in the fixture. In this way the position of the aligning fixture is firmly established. A pair of dowels insertable through the fixture extends into the high and low speed discs respectively. The mask 50 fixedly secured to the base member also is provided with a pair of apertures for receiving the insertable dowels. One of the apertures in the mask is in alignment with slot 112 in overlying relationship with the low speed disc 20 and the other aperture in mask 50, designated by the numeral 118, overlies the high speed disc 18 which includes an aperture rotatable into registry with aperture 118. The low speed disc, mounted on a two-piece adjustable hub, also includes an aperture 120 rotatable into registry with slot 112. As the discs 20 and 18 are rotated and their apertures brought into registry with the slot 112 and aperture 118, the insertable dowels on the fixture pass through the discs and synchronize the relative positions of the discs and the exposure mask.

Thus, each disc and the exposure assembly possess an aligning point coacting with an aligning point on each of the other members being aligned. When used in combination with the aid of a suitable fixture, it is possible to synchronize the members, securely fasten together the two-piece hub for disc 20 through slots 114 and secure base member 46 to the bottom plate 14. In this manner proper and precise alignment between the exposure assembly and the code-bearing discs is assured. As mentioned hereinbefore, the abutting wall 54 of the base member and mounting leg 74 of the light block are preferably machined to additionally assure complete, precise and repeated alignment therebetween when the light block is mounted on the base.

Since the light bulbs are wired in series, a failure of any of them will break the circuit preventing lighting of all the bulbs within the block. As shown in FIG. 3, an observation channel 122 in the terraced surface of the light block permits the operator to quickly observe a light failure prior to disassembly of the block from the base member. Upon failure of any of the light bulbs within the light block, it is possible to merely remove the entire light block as a unit and insert a replacement unit which previously had been machined to provide the proper aligned relationship with the base member. No readjustment or realignment is required and down time of the encoder is substantially reduced.

As will be apparent to persons skilled in the art, various modifications, adaptations and variations of the foregoing specific disclosure can be made without departing from the teachings of the present invention.

I claim:

1. In a position encoder for monitoring the movement of a device whose position is to be encoded wherein the encoder comprises a code-display station; code-bearing members including a code bearing disc having at least portions thereof movable through the display station; exposure means for directing a predetermined display pattern of columns of light toward the code-bearing members disposed in the code-display station and sensing means including a plurality of sensing elements responsive to the columns of light directed toward the code-display station; the combination wherein the exposure means includes a stationary exposure mask providing a plurality of exposure apertures disposed in said predetermined display pattern, said mask including alignment means for accurately positioning the mask relative to the code means; a replaceable exposure block fixedly mounting a plurality of separate light emitting members in an arrangement corresponding to said predetermined display pattern for alignment with the apertures in the stationary mask; said block being comprised of a box-like compartment having a terraced base provided with an inwardly offset segment accommodating said disc, a base for the exposure block supporting said exposure mask within the display station, and cooperative mounting and aligning means on the block and the base facilitating accurate and repeated assembly of the block on the base and alignment of the columns of light with said apertures without readjustment relative to the exposure mask.

2. The encoder of claim 1 wherein the cooperative mounting and aligning means includes mating surfaces on the block and the base in intimate confronting relationship, at least one dowel projecting from one of said surfaces and a dowel-receiving cavity in the other of said surfaces cooperating with the dowel to facilitate mounting of the block on the base.

3. The encoder of claim 1 wherein the replaceable exposure block is comprised of a box-like compartment and a mounting leg projecting outwardly therefrom, the compartment including a plurality of individual channels arranged in said predetermined display pattern, and said individual light emitting members secured in the channels for directing the columns of light toward the sensing elements.

4. The encoder of claim 1 wherein the base includes a central mounting portion and the replaceable exposure block is an L-shaped member comprised of a light compartment overlying the central mounting portion and a mounting leg projecting outwardly from the compartment at substantially a right angle thereto, the cooperative mounting and aligning means including flat abutting surfaces on the base and the block, the abutting surface on the block being on the mounting leg thereof.

5. The encoder of claim 1 wherein the exposure mask is positioned intermediate said code-bearing members.

6. The encoder of claim 1 wherein the base for the exposure block includes a central body portion and side portions projecting from the body portion for supporting the mask above the body portion intermediate said code-bearing members, the replaceable exposure block including a light bulb compartment mounted on the base intermediate the central body portion and the mask and individual light bulbs secured in the compartment immediately adjacent the mask, said bulbs being electrically connected in series.

7. The encoder of claim 1 wherein the light emitting members are individual light bulbs secured within the exposure block to provide a plurality of substantially parallelized light columns directed toward the sensing elements.

8. The encoder of claim 1 wherein the code bearing members include a low speed rotary code member and a high speed rotary code member, each of said members having plural tracks of binary code bits which together constitute a composite code sequence, a gear train coupling said code members together wherein the gear ratio causes the low speed code member to advance through a certain rotary segment while the high speed rotary code member advances through one complete rotation, said encoder including means connecting said gear train to an external device whose position is to be encoded.

* * * * *